(12) United States Patent
Hanbuecken et al.

(10) Patent No.: US 9,165,722 B2
(45) Date of Patent: Oct. 20, 2015

(54) METHOD FOR PRODUCING A CAPACITOR INCLUDING AN ARRAY OF NANOCAPACITORS

(75) Inventors: Margrit Hanbuecken, Cassis (FR); Eric Moyen, Cassis (FR); Lionel Santinacci, Le Beausset (FR); Francois Arnaud D'Avitaya, Marseilles (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 72 days.

(21) Appl. No.: 13/813,166

(22) PCT Filed: Jul. 28, 2011

(86) PCT No.: PCT/IB2011/053374
§ 371 (c)(1),
(2), (4) Date: May 20, 2013

(87) PCT Pub. No.: WO2012/014177
PCT Pub. Date: Feb. 2, 2012

(65) Prior Publication Data
US 2013/0224394 A1 Aug. 29, 2013

(30) Foreign Application Priority Data
Jul. 30, 2010 (FR) ..................................... 10 03212

(51) Int. Cl.
*B05D 5/12* (2006.01)
*H01G 13/00* (2013.01)
(Continued)

(52) U.S. Cl.
CPC .................. *H01G 13/00* (2013.01); *B05D 5/12* (2013.01); *B82Y 10/00* (2013.01); *H01G 4/01* (2013.01);
(Continued)

(58) Field of Classification Search
USPC ..................... 427/79–81, 510, 555, 558, 282; 29/25.41, 25.42
See application file for complete search history.

(56) References Cited

U.S. PATENT DOCUMENTS 7,736,527 B2 * 6/2010 Kim et al. ......................... 216/6
2006/0032526 A1 2/2006 Fukutani et al.
(Continued)

FOREIGN PATENT DOCUMENTS

DE 10 2006 013 245 10/2007

OTHER PUBLICATIONS

Banerjee, P. et al., "Nanotubular metal-insulator-metal capacitor arrays for energy storage," Nature Nanotechnology, vol. 4, pp. 292 to 296, (2009) XP-009144550.
(Continued)

*Primary Examiner* — Brian K Talbot
(74) *Attorney, Agent, or Firm* — Oblon, McClelland, Maier & Neustadt, L.L.P.

(57) ABSTRACT

A method for producing a capacitor including an array of nanocapacitors, in which the following operations are performed using a mold having a sealed surface, as a lower surface, and a top surface through which a network of pores extend: (a) filling the pores of the mold and covering a top surface of the mold with an electrically conductive material, to form a structure including an array of nanoscale objects connected by a single substrate; (b) removing the mold; (c) depositing, on an outline of the structure obtained at the end of (b), at least one bilayer including a first layer of an electrically insulating material and a second layer of an electrically conductive material; and then (d) locally removing the at least one bilayer deposited in (c) from the substrate to form the electrical contact.

14 Claims, 3 Drawing Sheets

Figure 1A:
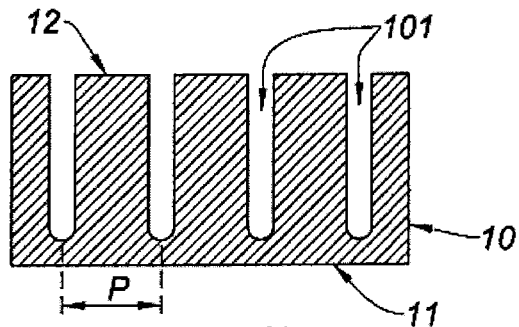

(51) Int. Cl.
  *B82Y 10/00* (2011.01)
  *H01G 4/01* (2006.01)
  *H01G 4/33* (2006.01)
  *H01G 4/38* (2006.01)
  *H01L 49/02* (2006.01)
  *H01G 11/10* (2013.01)
  *B82Y 40/00* (2011.01)

(52) U.S. Cl.
  CPC . *H01G 4/33* (2013.01); *H01G 4/38* (2013.01); *H01L 28/90* (2013.01); *B82Y 40/00* (2013.01); *H01G 11/10* (2013.01)

(56) References Cited

U.S. PATENT DOCUMENTS

| | | | |
|---|---|---|---|
| 2006/0086963 A1* | 4/2006 | Wu | 257/306 |
| 2007/0236863 A1* | 10/2007 | Lee et al. | 361/313 |
| 2007/0273463 A1* | 11/2007 | Yazdi | 335/78 |
| 2007/0286945 A1* | 12/2007 | Lahnor et al. | 427/80 |
| 2008/0142474 A1 | 6/2008 | Kim et al. | |
| 2008/0186648 A1* | 8/2008 | Choi et al. | 361/305 |
| 2008/0224264 A1 | 9/2008 | Park | |
| 2009/0103234 A1* | 4/2009 | Oh | 361/303 |
| 2011/0019337 A1* | 1/2011 | Chen et al. | 361/500 |
| 2011/0102968 A1* | 5/2011 | Choi et al. | 361/305 |
| 2011/0116209 A1 | 5/2011 | Park | |
| 2012/0088159 A1* | 4/2012 | Thomas et al. | 429/231.8 |

OTHER PUBLICATIONS

Chang, S. et al., "Fabrication of silicon nanopillar-based nanocapacitor arrays," Applied Physics Letters, American Institute of Physics, vol. 96, pp. 153108-1 to 153108-3, (2010) XP-012130833.

International Search Report Issued Nov. 23, 2011 in PCT/IB11/53374 Filed Jul. 28, 2011.

* cited by examiner

METHOD FOR PRODUCING A CAPACITOR INCLUDING AN ARRAY OF NANOCAPACITORS

The present invention relates to the field of nanocapacitor production.

The present invention more particularly relates to a process for producing a capacitor comprising a nanocapacitor array.

This type of array may especially be applied in the field of electronics. For example, the application may involve RFID (for Radio Frequency IDentfication) components. Specifically, in this type of application, a nanocapacitor array may supply the power required for the device to operate during a spike in consumption.

Processes for manufacturing a capacitor comprising a nanocapacitor array have already been reported.

For example, mention may be made of the article *"Nanotubular metal-insulator-metal capacitor arrays for energy storage"* by Parag Banerjee et al., Nature Nanotechnology, Vol. 4, May 2009 (referred to as D1 below).

The process described in this article uses an alumina membrane comprising many pores that are uniformly organized. Each pore is filled with concentric metal and electrically insulating films deposited, in succession, using an atomic layer deposition (ALD) process, until the pore is completely filled.

Cylindrical nanocapacitors are thus formed in each pore.

The nanocapacitors formed in this way, generally connected to the same electrical contact, for example allow a thin-film capacitor to be obtained the capacitance of which is about 10 pF/cm$^2$ for a 1 μm-thick alumina membrane.

However, this process has several limitations.

In particular, below a certain pore aspect ratio it is not possible to deposit the successive metal and electrically insulating films uniformly using the ALD process. The expression "aspect ratio" is understood to mean the ratio d/P of the diameter d of a pore to its depth P.

Specifically, deposition in a pore having an aspect ratio smaller than about 0.003 results in a nonuniform deposition. However, if the deposition is nonuniform, the films become nonconductive because they form a network of discontinuous grains between which current cannot flow. It is then not possible to form a nanocapacitor.

For a given pore diameter d, the depth P of the pores cannot be greater than a limiting value $P_{d,lim}$.

In this case, for a given pore density per membrane unit area, it is not possible to increase the depth of the pores, and therefore the height of the nanocapacitors, if it is desired to increase the overall capacitance of a capacitor formed in this way.

In addition, for a given pore depth P, the diameter d of the pores cannot be less than a limiting value $d_{P,lim}$.

In this case, for a membrane with given dimensions (width, length, height), it is not possible to increase the pore density per membrane unit area, and therefore it is not possible to increase the capacitance of the capacitor formed in this way.

With the ALD process employed by Banerjee et al., it is therefore necessary, once the aspect ratio limit of the pores in the membrane is reached, either to superpose a number of membranes (height), or to increase the size (width, length) of the membrane, or to do both, if it is desired to increase the capacitance of the capacitor.

One objective of the invention is to overcome this drawback.

Moreover, the capacitors obtained by the ALD technique have a stiffness that is directly dependent on that of the mold, which is retained in order to provide the nanocapacitors with mechanical support.

Another objective of the invention is therefore to provide a process for producing a capacitor comprising a nanocapacitor array, this capacitor simultaneously having a high capacitance while being flexible and able to withstand mechanical stresses, so as to be multipurpose.

To achieve at least one of these objectives, the invention provides a process for producing a capacitor comprising a nanocapacitor array, in which, starting with a mold having a closed side, called the backside, and a frontside onto which an array of pores opens, the following steps are carried out:

(a) the pores in the mold are filled and the frontside of this mold covered with an electrically conductive material in order to form a structure made up of an array of nano-objects connected by a single supporting member;

(b) the mold is removed;

(c) at least one bilayer made up of a first film of an electrically insulating material and a second film of an electrically conductive material is deposited on the outline of the structure obtained in step (b); and then (d) said at least one bilayer deposited in step (c) is removed locally from the supporting member in order to form an electrical contact.

With this process, the height of the nanocapacitors is theoretically no longer limited. This allows, for pores of a given diameter in the mold, i.e. for a given pore density per mold unit area, the capacitance of the capacitor formed by the process to be increased.

Moreover, with this process, the diameter of the nanocapacitors is theoretically no longer limited. This allows, for pores of a given height in the mold, the diameter of the pores to be decreased, i.e. it allows the pore density per mold unit area to be increased and therefore the capacitance of the capacitor formed by the process to be increased.

The process will possibly comprise other technical features, whether used in isolation or in combination:

the process may comprise, between step (b) and step (c), an additional step of depositing a protrusion on the supporting member, this protrusion being intended to serve as an electrical contact;

the material deposited in step (a) may be a metal or a polymer;

step (a) may comprise the following substeps:

(a1) a superficial film of electrically conductive material is deposited on the surface of the mold in order to form an electrical contact, and (a2) electrodeposition of this material is carried out on the superficial film formed beforehand;

the material to be deposited in step (a) being a polymer, step (a) may comprise the following substeps:

(a'1) the pores in the mold are filled with a liquid comprising at least one monomer and/or at least one polymer and a curing agent, (a'2) the frontside of the mold is spin coated with this liquid, and (a'$_3$) the liquid is solidified, for example by baking it or by exposing it to ultraviolet light;

the pores in the mold may have a geometry and respective positions that are preset in order to form an organized array of pores;

the pitch separating two pores in the organized array lies between 10 nm and 1 μm;

the mold may be chosen from: an alumina membrane, porous silicon or nanotubes of metal oxides such as titanium oxide, tantalum oxide, tungsten oxide, hafnium oxide or zirconium oxide;

step (b) may consist in dissolving the mold using a chemical or electrochemical process;

step (c) may be carried out by atomic layer deposition;

step (c) may comprise a step in which a thick film of electrically insulating material is deposited on the film of electrically conductive material in order to completely coat the structure produced beforehand;

the process may comprise, between step (a) and step (b), an intermediate step ($i_1$) in which the backside of the mold is opened, so that the array of nano-objects also opens onto this backside;

the process may comprise, after step ($i_1$) and before step (b), another intermediate step ($i_2$) in which a film of electrically conductive material is deposited on the backside of the mold in order to cover this backside;

the electrically conductive material deposited in step ($i_2$) being a metal, the deposition may be carried out by physical vapor deposition, chemical vapor deposition, or electrodeposition;

the electrically conductive material deposited in step ($i_2$) being a polymer, the deposition may be carried out by electrodeposition, by spin coating or by physical polymerization;

the process may comprise, in step (c), deposition of a plurality of bilayers, each bilayer being made up of a first film of an electrically insulating material and a second film of an electrically conductive material; and/or the pores in the mold may have a diameter of between 5 nm and 500 nm.

Figure 2:
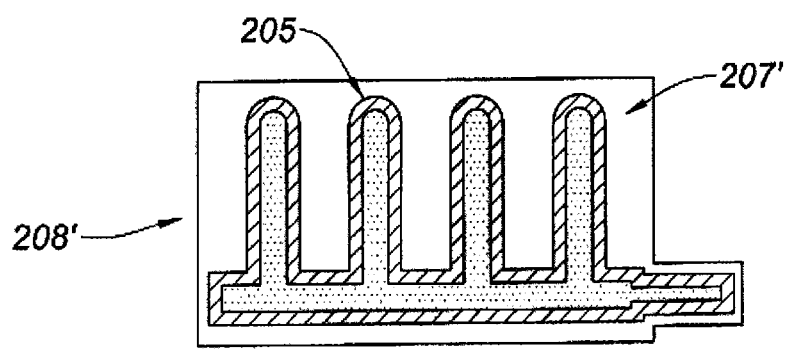
Figure 4:
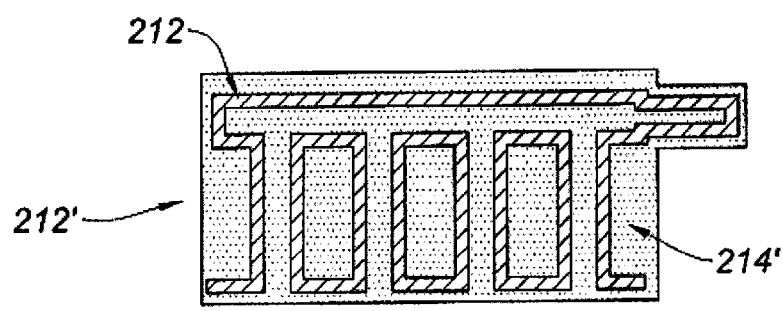

Other features, aims and advantages of the invention will become clear from the detailed description given below with reference to the following figures:

FIG. 1, which comprises FIGS. 1(a) to 1(f), shows the various structures obtained by carrying out a first embodiment of the process for producing a capacitor formed from an array of nanocapacitors, according to the invention;

FIG. 2 shows an intermediate structure obtained according to a variant of the first embodiment of the process according to the invention;

FIG. 3, which comprises FIGS. 3(a) to 3(h), shows the various structures obtained by carrying out a second embodiment of the process for producing a capacitor formed from an array of nanocapacitors, according to the invention; and FIG. 4 shows an intermediate structure obtained according to a variant of the second embodiment of the process according to the invention.

A nanocapacitor is a capacitor having the dimensions of a nano-object. The term "nano-object" is understood to mean an object with a nanoscale size, i.e. an object having at least one dimension lying between a few nanometers and a few hundred nanometers.

The invention relates to a process for producing a capacitor comprising a nanocapacitor array.

Starting with a mold 10 having a closed side 11, called the backside, and a frontside 12 onto which an array of pores 101 opens, this process involves carrying out the following steps:

(a) the pores 101 in the mold 10 are filled and the frontside 12 of this mold 10 covered with an electrically conductive material 20 in order to form a structure 200 made up of an array of nano-objects 201 connected by a single supporting member 202;

(b) the mold 10 is removed;

(c) at least one bilayer made up of a first film 205, 212 of an electrically insulating material and a second film 207, 214, 207', 214' of an electrically conductive material is deposited on the outline of the structure obtained in step (b); and then (d) said at least one bilayer deposited in step (c) is removed from the supporting member 202 in order to form an electrical contact.

The structures obtained after the various steps in a first embodiment of this process are shown in FIGS. 1(a) to 1(f).

A cross-sectional view of the mold 10 is shown in FIG. 1(a).

The pores 101 in the mold 10 may have a geometry and respective positions that are preset in order to form an organized array of pores. This is the case for the mold shown in FIG. 1(a).

For this reason, it is advantageously possible to use a mold 10 made from an alumina membrane, porous silicon or nanotubes of metal oxides such as titanium oxide, tantalum oxide, tungsten oxide, hafnium oxide or zirconium oxide.

The pitch P separating two pores 101 of the organized array may lie between 10 nm and 1 μm.

The pores 101 may have a diameter of between 5 nm and 500 nm, whether they are arranged in an organized array or not.

The depth of the pores 101 is not limited, provided the nano-objects 201 obtained keep their shape without sagging or making contact with one another. For this reason, the process may be carried out in such a way that the supporting member 202 is located above the nano-objects 201, relative to the direction of gravity, the nano-objects 201 thus hanging from the supporting member 202.

Figure 1B:
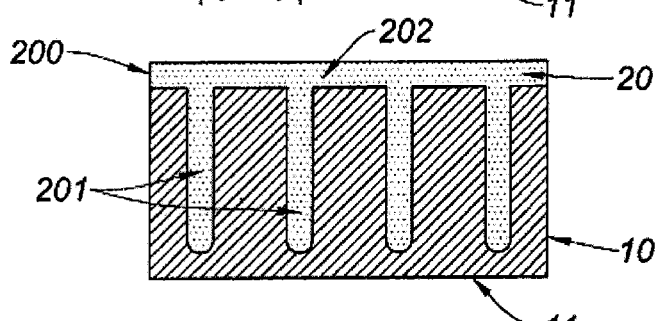

The structure 200 obtained after step (a) is shown in FIG. 1(b). It comprises an array of nano-objects 201 formed in the pores 101 in the mold and a supporting member 202 connecting these nano-objects to one another.

The material 20 of which the structure 200 is made is an electrically conductive material. This may be a metal or an electrically conductive polymer. Polymers that may be used may be chosen from at least one of the following polymers: polypyrrole, polyaniline, polyacetylene, and poly(dioctylbithiophene).

Step (a) may be carried out using an electrochemical process.

More precisely, step (a) may comprise the following substeps:

(a1) a superficial film of electrically conductive material 20 is deposited by physical evaporation on the surface of the mold 10 in order to form an electrical contact; and (a2) electrodeposition of this material 20 is carried out on the superficial film formed beforehand.

The physical evaporation carried out in step (a-⌊) may be any physical evaporation method known in the art. The surface of the mold 10 comprises the walls of the pores 101 in this mold 10, and the frontside 12 of the mold 10.

The electrodeposition carried out in step (a2) is an electrochemical growth step that is carried out in an electrolyte solution containing the electrically conductive material. For example, this may be a metal in ionic form which will be used to form nanowires. The crystallites of electrically conductive material (a metal for example) obtained during the deposition by physical evaporation in step (a-⌊) serve as points seeding the growth of the structure 200 that is eventually formed.

Electrodeposition may especially be employed when the electrically conductive material 20 is a metal.

In the particular case where the material 20 to be deposited in step (a) is an electrically conductive polymer, this step comprises the following substeps:

(a'1) the pores 101 in the mold 10 are filled with a liquid comprising at least one monomer and/or at least one polymer and a curing agent;

(a'2) the frontside 12 of the mold 10 is spin coated with this liquid; and (a'3) the liquid is solidified, for example by baking it or by exposing it to ultraviolet light.

It is advantageous to use spin coating to deposit a polymer because spin coating is easier to implement and more economical than the electrochemical techniques generally used with metals.

The solidification of the liquid carried out in step (a'$_3$) is achieved by virtue of the curing agent, which acts under the effect of a bake or ultraviolet light. In the case of a bake, the baking temperature generally lies between room temperature and a few hundred degrees Celsius.

As a variant, if the material 20 to be deposited in step (a) is a polymer, the latter may be deposited by physical polymerization. It is then a question of depositing the polymer from a vapor phase. This polymer deposition technique is advantageous because it is easier to implement and more economical than the electrochemical techniques generally used with metals.

The various processes employed to fill the pores 101 with the material 20 do not have the limitations imposed by the atomic layer deposition technique used in the prior art. This is because, in the context of the invention, it is no longer a question of uniformly depositing successive concentric films in the pores, but of filling them completely.

Step (b) may consist in dissolving the mold 10 using a chemical or electrochemical process.

When a chemical process is employed, any acid may be used to dissolve the mold 10. In the case of an alumina mold, phosphoric acid may be used, for example.

When an electrochemical process is employed, the electric field may be applied to an acid solution, for example comprising phosphoric acid, in which the mold 10, for example made of alumina, is immersed. The application of an electric field to this solution guides the chemical dissolution along the electric field direction.

Once the mold has been removed, a structure is obtained on which it is possible to deposit films of electrically insulating and electrically conductive materials, in succession, in order to form the nanocapacitor array.

Figure 1C:
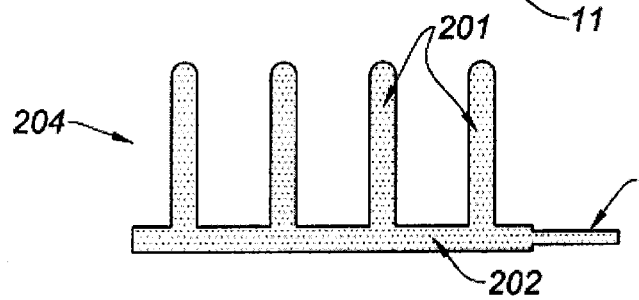

A protrusion 203, intended to form the electrical contact of the capacitor, may then be deposited on the supporting member 202, in order to obtain the structure 204 shown, in cross section, in FIG. 1(c).

It will be noted that, in the embodiment illustrated, this structure 204 has been flipped so as to rest on its supporting member 202, cf. FIG. 1(c).

This does not in any way prevent the subsequent deposition of the film 205 on the bearing side of the structure 204, because mechanical vibration in the tools used to implement the process is enough to expose the a priori unexposed side of the structure 204 for deposition.

Advantageously, any vibrating means allowing this a priori unexposed side to be exposed may be provided. Alternatively, the deposition may be carried out in two steps, so as to obtain a deposit on the one or more exposed sides of the structure, followed by deposition on the one or more sides that were not exposed in the preceding step.

The protrusion 203 may be produced by depositing, either manually or automatically, a nanowire on the end of the supporting member 202, and it may be fixed by standard microelectronic techniques such as microwelding or ultrasonic bonding. For this purpose, a material identical to the material 20 from which the structure 200 was formed will possibly be used, but any other electrically conductive material capable of being deposited on the supporting member 202 may be used. As a result, the protrusion 203 is integrated into the supporting member 202 so as to protrude from the supporting member 202.

As a variant, an additional mold (not shown) having a shape such that the protrusion is formed in step (a) could be associated with the mold 10.

Figure 1D:
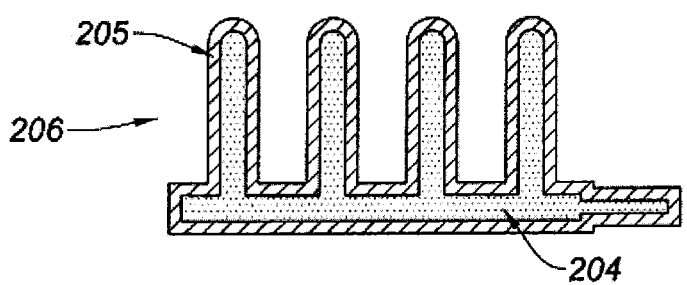
Figure 1E:
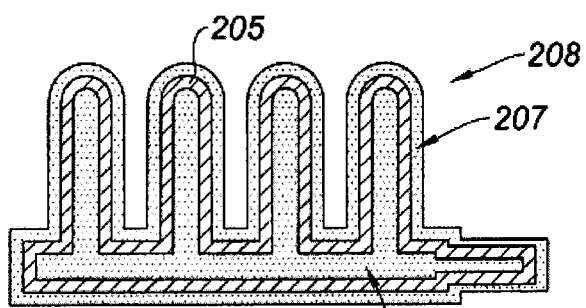

The structure 208 obtained after step (c) is shown in FIG. 1(e). It comprises, relative to the structure 204 shown in FIG. 1(c), a bilayer made up of a first film 205 of an electrically insulating material and a second film 207 of an electrically conductive material.

More precisely, firstly the first film 205 made of an electrically insulating material is deposited on the structure 204 in order to obtain a new structure, referenced 206 and shown in FIG. 1(d). This dielectric film 205 completely envelops the structure 204.

Next, the second film 207 made of an electrically conductive material is deposited on the structure 206, in order to obtain the structure 208 shown, again in cross section, in FIG. 1(e). This electrically conductive film 207 completely envelops the dielectric film 205 deposited beforehand.

Step (c) may consist in depositing each of the two films 205, 207 of the bilayer by atomic layer deposition. The thickness of each of these films may range from the thickness of one atomic layer to several hundred nm. Theoretically, the thickness capable of being obtained with this technique is not limited, the deposition time being the limiting factor. Furthermore, the thickness of the deposited films is chosen depending on the desired characteristics of the nanocapacitors.

A plurality of bilayers each made up of a first film of an electrically insulating material and a second film of an electrically conductive material may be deposited in succession in step (c).

Each bilayer deposition approximately doubles the potential capacitance of the capacitor.

Lastly, step (d) consists in forming the electrical contact. To do this, the films deposited in succession are locally removed from the protrusion of the supporting member 202.

Figure 1F:
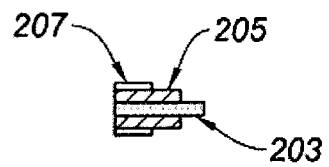

An enlargement of the periphery of the protrusion 203 obtained after step (d) is shown, in cross section, in FIG. 1(f). In order to expose the electrical contact 203, the electrical conductor 207 is etched using a chemical (or plasma) process that is selective relative to the dielectric 205. Next, over a smaller distance, the dielectric 205 is etched using a chemical (or plasma) process that is selective relative to the electrical conductor 207 and the electrical contact 203. These chemical etchings may be carried out using an acid or an acid mixture.

FIG. 2 shows, in cross section, a structure 208' obtained according to a variant of the process described above.

In this variant, step (c) comprises a step in which a thick film 207' of electrically conductive material is deposited on the film 205 of electrically insulating material, this film being thick enough to completely coat the structure 206. This thick film 207' provides better mechanical protection of the nanocapacitors, and better protects the latter from the environment (dust, oxidation of certain films of the structure, etc.).

The structures obtained after the various steps of a second embodiment of the process according to the invention are shown in FIGS. 3(a) to (h).

In this variant, the nano-objects 201 and their common supporting member 202 are formed in the same way as in the first embodiment of the process according to the invention.

Figure 3A:
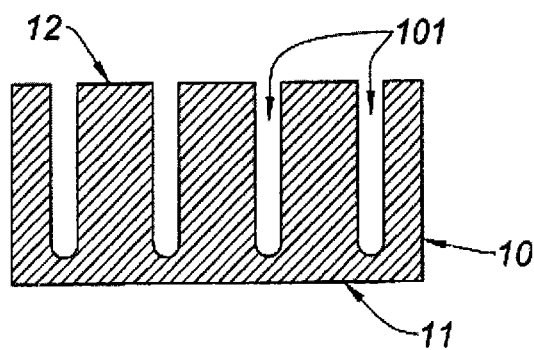
Figure 3B:
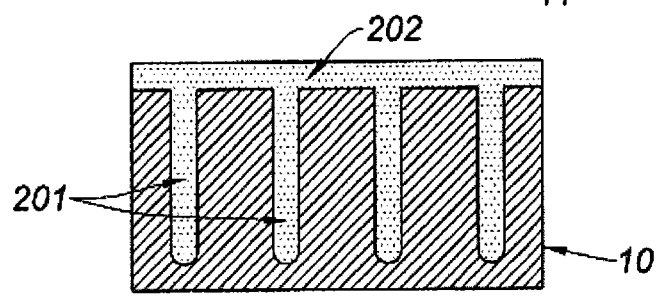

Thus, starting with a mold 10 having a closed side 11, called the backside, and a frontside 12 onto which an array of pores 101 opens, this process begins with step (a). The mold 10 used is shown in FIG. 3(a) and is in keeping with the mold shown in FIG. 1(a). Moreover, the structure obtained after step (a) is shown in FIG. 3(b), and it is in keeping with the structure shown in FIG. 1(b).

However, before carrying out aforementioned step (b), this variant makes provision for two successive intermediate steps.

In a first intermediate step (h), the backside 11 of the mold 10 is opened, so that the array of nano-objects 201 also opens onto this backside 11.

Figure 3C:
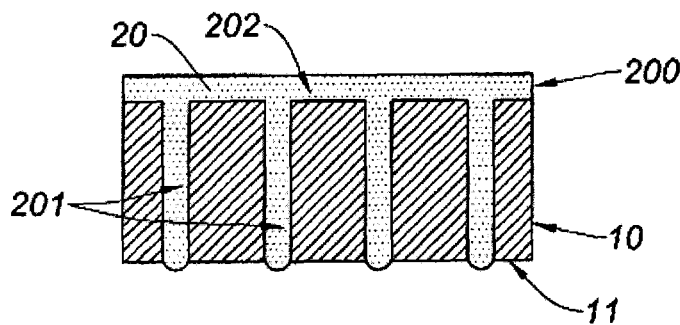

The structure thus obtained is shown in FIG. 3(c). As may be seen in FIG. 3(c), all the nano-objects now protrude from the backside 11 of the mold 10.

To do this, step (h) is a chemical or electrochemical process implemented in a similar way to the complete removal of the mold carried out in step (b), but partially. Specifically, a thickness smaller than the total thickness of the mold 10 is removed.

Next, in a second intermediate step ($i_2$), a film 209 of an electrically conductive material is deposited on the backside 11 of the mold in order to cover this backside 11.

Figure 3D:
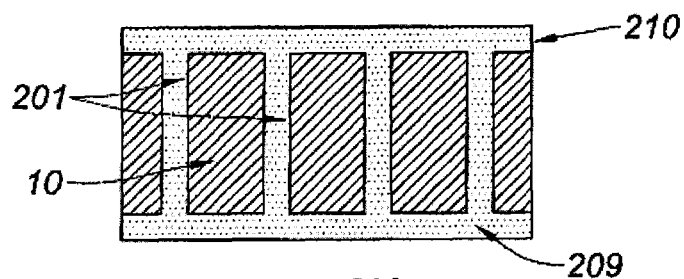

The structure thus obtained is shown in FIG. 3(d).

The film 209 is generally made with the same material 20 as the nano-objects 201 and the supporting member 202. However, it could be envisioned to use another type of electrically conductive material for this film 209, which will possibly be deposited on the nano-objects 201.

If the electrically conductive material deposited in step ($i_2$) is a metal, the deposition may be carried out using a physical vapor deposition, chemical vapor deposition or electrodeposition process.

If the electrically conductive material deposited in step ($i_2$) is a polymer, the deposition may be carried out using an electrodeposition, spin-coating or physical polymerization process.

Starting with the structure obtained after the second intermediate step ($i_2$), step (b) is carried out, in which the rest of the mold 10 is completely removed.

This step (b) is in keeping with that carried out in the first variant of the process.

Next, a protrusion 203 may be deposited on the supporting member 202, this protrusion being intended to serve as an electrical contact. As a variant, this protrusion may be deposited in step (a), using a mold 10 shaped such that the supporting member 202 has such a protrusion.

Figure 3E:
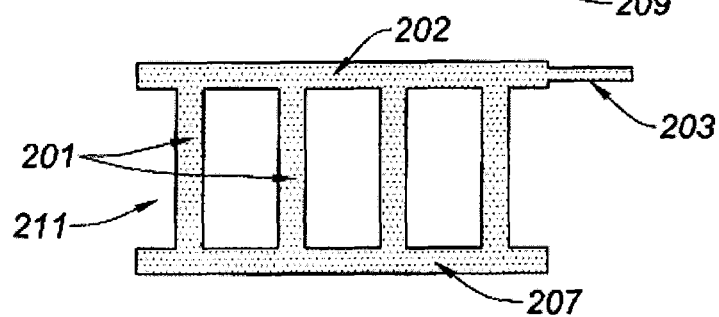

After this step of depositing the protrusion 203, the structure 211 shown in FIG. 3(e) is obtained.

The benefit of carrying out the intermediate steps ($i_1$) and ($i_2$) between steps (a) and (b) of the process mainly lies in the fact that the ladder-shaped structure 211 shown in FIG. 3(e) is stiffer than the comb-shaped structure shown in FIG. 1(c).

Thus, this structure 211 allows nano-objects 201 that have a high aspect ratio and/or are made of a relatively pliable material 20, especially a polymer, to be employed without running the risk of breakages.

Next, steps (c) and (d) are carried out as described above.

Figure 3F:
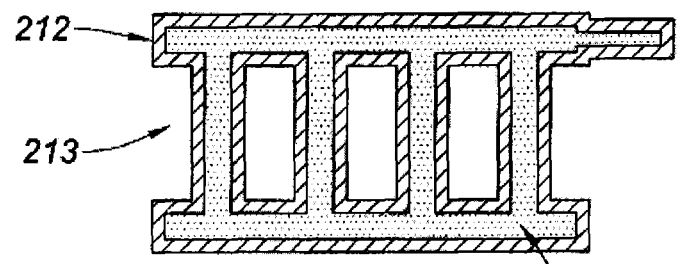

Thus, the first film of the bilayer deposited in step (c) is a film 212 of an electrically insulating material that completely covers the structure 211, as shown in FIG. 3(f). The structure 213 is then formed.

Figure 3G:
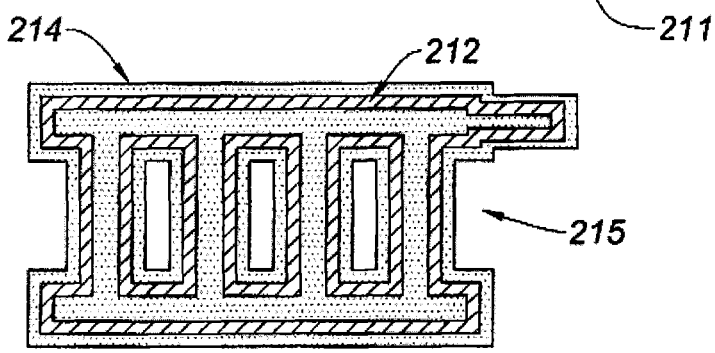
Figure 3H:
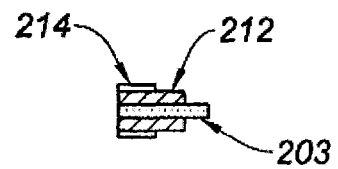

The second film 214 of this bilayer is a film of an electrically conductive material, the deposition of which forms the structure 215 shown in FIG. 3(g).

It will be understood that the deposition techniques that can be used are the same as in the first variant of the process.

Next, the electrical contact 203 is exposed using the same process as in the first variant.

Here again, a plurality of bilayers may be deposited in step (c).

Finally, FIG. 4 shows a cross-sectional view of a structure 212' obtained with a variant of the process described above with reference to FIGS. 3(a) to 3(h).

In this variant, step (c) comprises a step in which a thick film 214' of electrically conductive material is deposited on the film 212 of electrically insulating material, in order to completely coat the structure 215.

Whatever the envisioned embodiment, the invention allows a capacitor to be manufactured, which capacitor comprises an, optionally organized, nanocapacitor array, in which the height of the nanocapacitors is theoretically limitless, though in practice limits exist due to strength-related problems.

It is thus possible to increase, for a given number of nanocapacitors per mold unit area, the capacitance of the capacitor.

Moreover, whatever the envisioned embodiment, the diameter of the nanocapacitors is in theory no longer limited, though in practice limits exist due to strength-related problems.

This allows, for pores in the mold of a given height, the diameter of the pores to be decreased, i.e. its allows the density of pores per mold unit area to be increased and therefore the capacitance of the capacitor formed by the process to be increased.

Furthermore, the deposition of the electrical contact is a simple operation that does not take long to carry out.

It should also be noted that the small thickness of the capacitor obtained in the end gives it a relatively flexible structure, making it easy to handle without breaking, whether the electrically conductive material is a metal or a polymer.

In particular, a capacitor obtained with the process according to the invention will be much more flexible than a capacitor of the same capacitance obtained using an atomic layer deposition (ALD) process, such as employed in document D1.

This is because, with the ALD technique, the alumina mold in which the nanocapacitors are formed is not removed, because it is needed to mechanically support the deposited films. The capacitor finally obtained is very stiff because the Young's modulus of alumina is $3.9 \times 10^5$ MPa.

To improve the flexibility of a capacitor obtained with the ALD technique, it is then necessary to decrease the thickness of the mold, thereby decreasing the capacitance of the capacitor obtained.

The process according to the invention allows the mold to be removed, so that the flexibility of the capacitor obtained does not depend on the Young's modulus of this mold.

The flexibility of the capacitor obtained with the process according to the invention is further increased when the electrically conductive material used is a polymer, because polymers have Young's moduli at least 20 times smaller than those of metals.

The invention claimed is:

1. A process for producing a capacitor including a nanocapacitor array, the process comprising:
   (a) providing a mold having a closed side, as a backside, and a frontside onto which an array of pores opens;
   (b) filling pores in the mold and covering the frontside of this mold with an electrically conductive material to form a structure including an array of nano-objects connected by a supporting member;

($i_1$) opening the backside of the mold, so the array of nano-objects also opens onto the backside; then ($i_2$) depositing a film of electrically conductive material on the backside of the mold to cover the backside; then;

(c) removing the mold (d) depositing a protrusion on the supporting member, the protrusion configured to serve as an electrical contact, followed by depositing at least one bilayer made up of a first film of an electrically insulating material and a second film of an electrically conductive material on an outline of the structure obtained in (c); and then (e) removing the at least one bilayer deposited in (d) locally from the supporting member to form the electrical contact.

2. The process as claimed in claim 1, in which the material filled in (b) is a metal or a polymer.

3. The process as claimed in claim 2, in which (b) comprises:

(b1) depositing a superficial film of electrically conductive material on a surface of the mold to form an electrical contact; and (b2) carrying out electrodeposition of the deposited material on the superficial film formed beforehand.

4. The process as claimed in claim 2, in which the material to be deposited in (b) is a polymer, and (b) comprises:

(b'1) filling the pores in the mold with a liquid comprising at least one monomer and/or at least one polymer and a curing agent;

(b'2) spin coating the frontside of the mold with the liquid; and (b'3) solidifying the liquid, or baking or exposing the liquid to ultraviolet light.

5. The process as claimed in claim 1, in which the pores in the mold have a geometry and respective positions that are preset to form an organized array of pores.

6. The process as claimed in claim 5, in which a pitch separating two pores in the organized array is between 10 nm and 1 μm.

7. The process as claimed in claim 1, in which the mold is chosen from: an alumina membrane, porous silicon, or nanotubes of metal oxides.

8. The process as claimed in claim 1, in which (c) includes dissolving the mold using a chemical or electrochemical process.

9. The process as claimed in claim 1, in which (d) is carried out by atomic layer deposition.

10. The process as claimed in claim 1, in which the electrically conductive material deposited in ($i_2$) is a metal, and the depositing is carried out by physical vapor deposition, chemical vapor deposition, or electrodeposition.

11. The process as claimed in claim 1, in which the electrically conductive material deposited in ($i_2$) is a polymer, and the depositing is carried out by electrodeposition or by spin coating.

12. The process as claimed in claim 1, in which, in (d), a plurality of bilayers are deposited, each bilayer including a first film of an electrically insulating material and a second film of an electrically conductive material.

13. The process as claimed in claim 1, in which the pores in the mold have a diameter of between 5 nm and 500 nm.

14. The process as claimed in claim 7, in which the nanotubes of metal oxides are chosen from titanium oxide, tantalum oxide, tungsten oxide, hafnium oxide, or zirconium oxide.

\* \* \* \* \*